United States Patent
Dahl et al.

(10) Patent No.: US 11,037,782 B1
(45) Date of Patent: Jun. 15, 2021

(54) HETEROSTRUCTURE SEMICONDUCTOR DEVICE AND MANUFACTURING METHOD

(71) Applicant: Comptek Solutions Oy, Turku (FI)

(72) Inventors: Johnny Dahl, Turku (FI); Jouko Lang, Lieto (FI); Vicente Calvo Alonso, Piispanristi (FI)

(73) Assignee: Comptek Solutions Oy, Turku (FI)

( * ) Notice: Subject to any disclaimer, the term of this patent is extended or adjusted under 35 U.S.C. 154(b) by 5 days.

(21) Appl. No.: 16/634,606

(22) PCT Filed: Jul. 27, 2018

(86) PCT No.: PCT/FI2018/050559
§ 371 (c)(1),
(2) Date: Jan. 28, 2020

(87) PCT Pub. No.: WO2019/020872
PCT Pub. Date: Jan. 31, 2019

(30) Foreign Application Priority Data

Jul. 28, 2017 (GB) ..................................... 1712143

(51) Int. Cl.
*H01L 21/00* (2006.01)
*H01L 21/02* (2006.01)

(52) U.S. Cl.
CPC .... *H01L 21/02546* (2013.01); *H01L 21/0254* (2013.01); *H01L 21/02241* (2013.01);
(Continued)

(58) Field of Classification Search
CPC ......... H01L 21/02546; H01L 21/02241; H01L 21/02271; H01L 21/02389;
(Continued)

(56) References Cited

U.S. PATENT DOCUMENTS

| 5,909,614 | A | 6/1999 | Krivoshlykov |
| 5,965,908 | A | 10/1999 | Shibata et al. |

(Continued)

FOREIGN PATENT DOCUMENTS

| DE | 102015117874 A1 | 4/2017 |
| JP | H09320967 A | 12/1997 |
| WO | 2012062966 A1 | 5/2012 |

OTHER PUBLICATIONS

Punkkinen et al., "Oxidized In-containing IIV-V (100) Surfaces: Formation of Crystalline Oxide Films and Semiconductor-oxide Interfaces," Physical Review B 83, 195329 (2011).
(Continued)

*Primary Examiner* — Richard A Booth
(74) *Attorney, Agent, or Firm* — James C. Lydon

(57) ABSTRACT

Disclosed is a semiconductor device and a method of fabricating the semiconductor device. The semiconductor device comprises a first III-V compound semiconductor layer having a first material structure, a second semiconductor layer having a second material structure and a third semiconductor layer having a third material structure. An interface between the first semiconductor layer and the second semiconductor layer consists of at least one corresponding crystalline terminating oxide layer of the first semiconductor layer, and an interface between the second semiconductor layer and the third semiconductor layer comprises at least one corresponding crystalline terminating oxide layer of a III-V compound semiconductor layer.

20 Claims, 3 Drawing Sheets

(52) U.S. Cl.
CPC .. *H01L 21/02271* (2013.01); *H01L 21/02389* (2013.01); *H01L 21/02392* (2013.01); *H01L 21/02395* (2013.01); *H01L 21/02458* (2013.01); *H01L 21/02461* (2013.01); *H01L 21/02463* (2013.01); *H01L 21/02483* (2013.01); *H01L 21/02507* (2013.01); *H01L 21/02516* (2013.01); *H01L 21/02543* (2013.01); *H01L 21/02565* (2013.01); *H01L 21/02609* (2013.01)

(58) Field of Classification Search
CPC ......... H01L 21/02392; H01L 21/02395; H01L 21/02458; H01L 21/02461; H01L 21/02463; H01L 21/02483; H01L 21/02507; H01L 21/02516; H01L 21/0254; H01L 21/02543; H01L 21/02565; H01L 21/02609
See application file for complete search history.

(56) References Cited

U.S. PATENT DOCUMENTS

| | | | |
|---|---|---|---|
| 6,916,717 B2* | 7/2005 | Li | C30B 25/18 438/287 |
| 7,067,856 B2* | 6/2006 | Ramdani | C30B 25/18 257/190 |
| 9,269,763 B2 | 2/2016 | Laukkanen et al. | |
| 9,666,677 B1* | 5/2017 | Raring | H01L 27/0676 |
| 9,837,486 B2 | 12/2017 | Laukkanen et al. | |
| 10,256,290 B2 | 4/2019 | Laukkanen et al. | |
| 2012/0061728 A1 | 3/2012 | Javey et al. | |
| 2014/0353771 A1 | 12/2014 | Wang et al. | |
| 2015/0060873 A1 | 3/2015 | Chiu et al. | |
| 2016/0351698 A1 | 12/2016 | Yang | |
| 2017/0104083 A1 | 4/2017 | Chiu et al. | |
| 2018/0218901 A1 | 8/2018 | Kuzmin et al. | |
| 2020/0274332 A1* | 8/2020 | Calvo Alonso | H01L 21/02565 |

OTHER PUBLICATIONS

Qin et al., "A Crystalline Oxide Passivation for Al2O3/AlGaN/GaN," Applied Physics Letters, 105, 141604 (2014).

* cited by examiner

HETEROSTRUCTURE SEMICONDUCTOR DEVICE AND MANUFACTURING METHOD

TECHNICAL FIELD

The present disclosure relates generally to semiconductor devices; more specifically to heterostructure semiconductor devices that are epitaxially fabricated using III-V semiconductor materials. Moreover, the present disclosure concerns methods of manufacturing aforesaid semiconductor devices.

BACKGROUND

Contemporary semiconductors are manufactured using semiconductor fabrication processes, including semiconductor crystal growth and epitaxy. In order to provide useful operating characteristics, for example in III-V semiconductor devices, it is desirable to achieve improved crystallinity in III-V compound semiconductor heteroepitaxy and regrowth, for enabling novel types of semiconductor heterostructures to be realized in practice.

In regard to environmental considerations, it is desirable to reduce energy consumption in devices, and improve operating efficiency of devices. In recent times, there has been an ongoing transition related to using compound semiconductors in many electronic devices, such as optoelectronic devices, wherein III-V semiconductor materials are able to offer superior performance compared to silicon-based electronic devices. In many cases, limiting factors for device performance arise from defective interfaces of materials employed for fabricating devices. Moreover, in some cases, a limiting factor pertains to semiconductor material properties.

Semiconductor regrowth is a commonly used method when producing compound semiconductor devices, for example optoelectronic device structures. Such a method enables structures to be manufactured, that would not be feasible to fabricate using other manufacturing methods. However, the aforesaid semiconductor regrowth method has been hindered by a difficulty in growing good quality epitaxial material on surfaces, that have been exposed to gases at atmospheric pressure, that have been exposed to etching processes, and other similar types of processing.

In regard to compound heterostructure devices, different material layers are grown on top of each other therein, in a stacked layer configuration. Such material layers may be grown in vacuum conditions to enable proper crystal growth and to prevent incorporation of impurities in the material layers. However, in practice, when growing a layer of epitaxial material onto an existing layer, when the existing layer is of a low crystalline quality, namely includes a high density of crystal plane dislocations and/or a high density of impurities; a problem arises that defects present in the existing layer cause corresponding defects, for example crystal plane dislocations, to propagate into the grown layer of epitaxial material, thereby adversely affecting its electrical characteristics, for example electron-hole mobility, density of recombination sites and so forth. In some severe cases, when the existing layer has a concentration of defects that is above a higher threshold, growth of the aforesaid epitaxial layer is prevented altogether.

Problems associated with growing the epitaxial layer onto the existing layer are encountered, for example, when a semiconductor substrate, for example a semiconductor wafer, having the existing layer as an exposed external surface thereof is removed from a growth chamber, undergoes one or more processes, and, after performing these one or more so processes, new semiconductor material is to be grown onto the existing layer of the substrate. While removing the semiconductor wafer from the growth chamber for processing, the semiconductor wafer surface, namely the existing layer, may readily oxidize creating a low-quality starting surface for the subsequent regrowth process to provide the aforesaid epitaxial layer.

In order to grow epitaxial semiconductor material onto a given surface successfully, the given surface must have an adequate quality of crystallinity. Moreover, semiconductor crystal regrowth on a given substrate surface can often require amorphous oxides to be cleaned from the oxidized substrate surface. Such cleaning may be achieved, for example, by chemically removing the oxides from the surface. However, even when such cleaning procedures are employed, the crystal quality of material grown epitaxially on the surface can be low because, the substrate surface is etched unevenly and does not regain all its crystallinity in the cleaning process or residues from various chemicals remain on the surface. Other known methods for removing surface oxides include heating in the presence of periodic table column V source gas. However, such known method can also degrade the surface quality, and are potentially not compatible with all other processes that may be employed during semiconductor fabrication.

Therefore, in light of the foregoing discussion, there exists a need to overcome the aforementioned drawbacks associated with conventional semiconductor devices and conventional manufacturing techniques.

SUMMARY

The present disclosure seeks to provide a semiconductor device. The present disclosure also seeks to provide a method of fabricating a semiconductor device. The present disclosure seeks to provide a solution to the existing problem of amorphous oxide layers and low crystallinity of grown semiconductor layers. An aim of the present disclosure is to provide a solution that overcomes at least partially the problems encountered in prior art, and provides an economical, easy to implement, sophisticated semiconductor device comprising crystalline terminating oxide layers for epitaxial growth of highly ordered semiconductor layers thereon.

In one aspect, an embodiment of the present disclosure provides a semiconductor device comprising:
- a first III-V compound semiconductor layer having a first material structure;
- a second semiconductor layer having a second material structure;
- a third semiconductor layer having a third material structure;

wherein an interface between the first semiconductor layer and the second semiconductor layer consists of at least one corresponding crystalline terminating oxide layer of the first semiconductor layer, and an interface between the second semiconductor layer and the third semiconductor layer comprises at least one corresponding crystalline terminating oxide layer of a III-V compound semiconductor layer.

In another aspect, an embodiment of the present disclosure provides a method of fabricating a semiconductor device comprising:
- a first III-V compound semiconductor layer having a first material structure; and
- a second semiconductor layer having a second material structure; wherein an interface between the first semiconductor layer and the second semiconductor layer consists of at least one corresponding crystalline terminating oxide layer of the first semiconductor layer; the method comprising:
  obtaining the first III-V compound semiconductor layer;
  absorbing an oxygen dosage into a surface of the first III-V compound semiconductor layer to form at least one corresponding crystalline terminating oxide layer;
  growing the second semiconductor layer onto a top of the formed at least one crystalline terminating oxide layer of the first semiconductor layer;
wherein forming of the corresponding crystalline terminating oxide layer comprises illuminating the first III-V compound semiconductor surface and/or the oxygen dosage with UV light.

In yet another aspect, embodiments of the present disclosure provide a computer program product comprising a non-transitory (namely non-transient) computer-readable storage medium having computer-readable instructions stored thereon, the computer-readable instructions being executable by a computerized device comprising processing hardware to execute the aforementioned method of fabricating a semiconductor device.

Embodiments of the present disclosure substantially eliminate or at least partially address the aforementioned problems in the prior art, and enables growth of thin, highly ordered crystalline terminating oxide layers for epitaxial growth of crystalline semiconductor layers thereon.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1A:
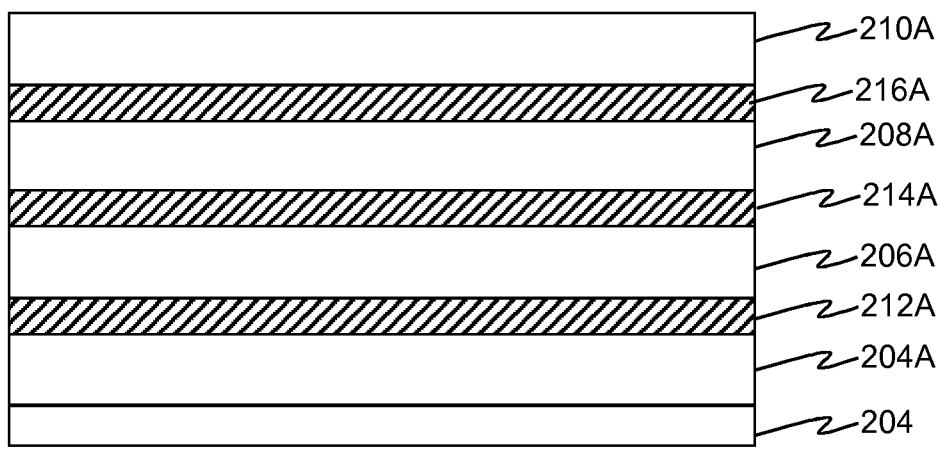
FIGS. 1A-1B are illustrations of exemplary implementations of the semiconductor device as epitaxial semiconductor stack structures, in accordance with different embodiments of the present disclosure.

In the accompanying diagrams, an underlined number is employed to represent an item over which the underlined number is positioned or an item to which the underlined number is adjacent. A non-underlined number relates to an item identified by a line linking the non-underlined number to the item.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In one aspect, an embodiment of the present disclosure provides a semiconductor device comprising:
  a first III-V compound semiconductor layer having a first material structure;
  a second semiconductor layer having a second material structure;
  a third semiconductor layer having a third material structure;
wherein an interface between the first semiconductor layer and the second semiconductor layer consists of at least one corresponding crystalline terminating oxide layer of the first semiconductor layer, and an interface between the second semiconductor layer and the third semiconductor layer comprises at least one corresponding crystalline terminating oxide layer of a III-V compound semiconductor layer.

In another aspect, an embodiment of the present disclosure provides a method of fabricating a semiconductor device comprising:
  a first III-V compound semiconductor layer having a first material structure; and
  a second semiconductor layer having a second material structure; wherein an interface between the first semiconductor layer and the second semiconductor layer consists of at least one corresponding crystalline terminating oxide layer of the first semiconductor layer;
  the method comprising:
    obtaining the first III-V compound semiconductor layer;
    absorbing an oxygen dosage into a surface of the first III-V compound semiconductor layer to form at least one corresponding crystalline terminating oxide layer;
    growing the second semiconductor layer onto a top of the formed at least one crystalline terminating oxide layer of the first semiconductor layer;
  wherein forming of the corresponding crystalline terminating oxide layer comprises illuminating the first III-V compound semiconductor surface and/or the oxygen dosage with UV light.

In yet another aspect, embodiments of the present disclosure provide a computer program product comprising a non-transitory (namely non-transient) computer-readable storage medium having computer-readable instructions stored thereon, the computer-readable instructions being executable by a computerized device comprising processing hardware to execute the aforementioned method of fabricating a semiconductor device.

The present disclosure provides a semiconductor device and a method of fabricating the semiconductor device. The semiconductor device comprises crystalline oxide structures formed on compound semiconductor materials that exhibit excellent properties regarding providing layers onto which subsequent crystalline epitaxial layers can be fabricated. Furthermore, the semiconductor device, with the crystalline terminating oxide layer, in accordance with the present disclosure may be formed using epitaxial manufacturing techniques, e.g., growing the III-V semiconductor by Metal Organic Chemical Vapor Deposition (MOCVD) and/or Molecular Beam Epitaxy (MBE). Moreover, such thin, yet highly ordered, crystalline terminating oxide layers exhibit excellent uniformity with smooth surface structures which allows use thereof as templates for subsequent semiconductor epitaxy to be performed so thereonto. Furthermore, the semiconductor device of the present disclosure can be implemented in several conventional applications, such as, a Field Effect Transistor (FET), wherein the conduction path is coupled between source and drain electrodes of the FET, and a gate electrode of the FET is operable to define the applied electric field.

The present device may comprise in addition to the layers listed above one or more semiconductor layers next to one another, without any crystalline terminating oxide layer therebetween. Furthermore, the interface between the second semiconductor layer and the third semiconductor layer comprises at least one corresponding crystalline terminating oxide layer of a III-V compound semiconductor layer, i.e. in case the second semiconductor layer is a III-V compound semiconductor layer, the crystalline terminating oxide layer has been formed on the second semiconductor layer, and the third semiconductor layer either on top of this crystalline terminating oxide layer or there are further layers before the third semiconductor layer. Alternatively, if the second semiconductor layer is not a III-V compound semiconductor layer, the interface comprises at least further semiconductor layer, a III-V compound semiconductor layer, and the crystalline terminating oxide layer has been formed thereon.

In an embodiment, the semiconductor device includes a plurality of semiconductor layers fabricated from III-V semiconductor materials. Specifically, the semiconductor device comprising the first semiconductor layer and second semiconductor layer having a first and a second material structure, respectively, may be fabricated from III-V semiconductor materials. More specifically, the first and the second material structure may be obtained by combining group III-A elements (namely, Boron, Aluminium, Gallium, Indium and Thallium) with group V-A elements (namely, Nitrogen, Phosphorous, Arsenide, Antimony and Bismuth) of the periodic table. Furthermore, the group III-A elements have three valence so electrons and group V-A elements have five valence electrons, and thereby provide the semiconductor layer with electrons and holes for current conduction. Some or all of the semiconductor layers can be partially or uniformly doped with suitable elements which are selected according to the application of the finished product. For example, the dopants can be selected from groups II or IV, such as Mg or Si. The doping level is also selected according to the application.

According to an embodiment, the first material structure, the second material structure and the third material structure is independently selected from a GaAs composition, an AlGaAs composition, an InGaP composition, an InGaN composition, an AlGaN composition, a GaN composition, an InP composition and InGaAs composition. In another embodiment, the first material structure is a GaAs composition and the second material structure is an AlGaAs composition. In another embodiment, the first material structure is an AlGaAs composition and the second material structure is a GaAs composition. In another embodiment, the first material structure is an InGaP composition and the second material is a GaAs composition. In another embodiment, the first material structure is an InGaN composition and the second material structure is an AlGaN composition. In yet another embodiment, the first material structure is a GaN composition and the second material structure is an AlGaN composition. Optionally, the first material structure is an InP composition and the second material structure is an InGaAs composition. More optionally, the first material structure is an InGaAs composition and the second material structure is an InP composition.

The semiconductor device comprises a first semiconductor layer having a first material structure. In an embodiment, the semiconductor layer may be a substrate layer onto which multiple layers of the semiconductor may be grown. Specifically, the substrate layer may be selected based on application of the semiconductor device. In such an embodiment, the multiple layers of semiconductor grown onto the substrate layer may comprise the first semiconductor layer.

The interface between the first semiconductor layer and the second semiconductor layer consists of at least one corresponding crystalline terminating oxide layer of the first semiconductor layer. Specifically, the at least one crystalline terminating oxide layer is a thin, highly ordered crystalline oxide layer. More specifically, the at least one crystalline terminating oxide layer is formed by transformation of the first semiconductor layer surface. In an embodiment, at least one crystalline terminating oxide layer has a crystal structure surface symmetry that is at least one of: (3×1), (3×2), (2×3), c(4×2), (2×1), (1×2), (3×3), (1×1), (4×3). In an embodiment, the at least one crystalline terminating oxide layer may have a surface symmetry similar to the surface symmetry of the first semiconductor layer. In an alternate embodiment, the at least one crystalline terminating oxide layer may have a surface symmetry different than surface symmetry of the first semiconductor layer. Furthermore, the crystalline terminating oxide layer is referred to as being a crystalline oxide layer; such a crystalline oxide layer is described in a US application US 2016/0049295 and U.S. Pat. No. 9,269,763 herein incorporated by reference. Further such layers are described in Qin et al., Applied Physics Letters 105, 141604 (2014). The same possibilities concerning the crystalline terminating oxide layer concern the other possible crystalline terminating oxide layers of the semiconductor device.

In an embodiment where the III-V material is InAs, the corresponding crystalline terminating oxide layers can be at least such crystalline terminating oxide layers which have a surface symmetry of c(4×2) and (3×1). In an embodiment where the III-V material is InGaAs, the corresponding crystalline terminating oxide layers can be at least such crystalline terminating oxide layers which have a surface symmetry of so c(4×2), (4×3), (3×1) and (3×2). In an embodiment where the III-V material is InP, the corresponding crystalline terminating oxide layers can be at least such crystalline terminating oxide layers which have a surface symmetry of (2×3). Further possible III-V materials and their corresponding crystalline terminating oxide layer (given in parentheses) are for example GaN (3√3×3√3–R30°), AlGaN (1×1), InSb (1×2), InGaSb (1×2), InAs (3×3), InGaAs (3×3), InP (1×1) and InGaP (1×1).

The method comprises illuminating the first III-V compound semiconductor surface and/or the oxygen dosage with UV light while forming of the corresponding crystalline terminating oxide layer. This method step is believed to be both novel and inventive over the known methods, i.e. even when only one crystalline terminating oxide layer is made. The UV light can be used immediately prior to the use of the oxygen, during use of the oxygen or immediately after the use of oxygen. Most typically, illumination with UV light is used during the forming of the corresponding crystalline terminating oxide layer, but it may also be used before (typically immediately before) and/or after the forming of this layer. It is also possible to use UV light only before and during, only before and after or only during and after the forming. Similarly, the UV-light may be directed to the oxygen flow or to the surface to be treated, or both.

By utilizing ultraviolet (UV) light, it is possible to alter the parameter space where the corresponding crystalline terminating oxide layer can be formed, i.e. to modify the required temperature, time and/or dosage of oxygen needed. Typically, the formation of corresponding crystalline terminating oxide layer needs an elevated temperature. In some embodiments the required temperature for forming a corresponding crystalline terminating oxide layer can be lowered by irradiating the oxygen atoms and/or the III-V compound semiconductor with UV light prior, during and/or after the absorption of oxygen atoms onto the III-V compound semiconductor surface.

Indeed, without wishing to be bound by a theory, the inventors believe that the crystalline structure may, immediately upon forming, be a non-organised structure. Thereafter, with the effect of UV light, the crystalline structure is organised to the desired structure. A benefit of lowering the required temperature is that during manufacturing of a semiconductor device, increased temperature required for the formation of a layer may have a negative effect on a previously formed layer. This negative effect can be avoided or at least minimised by the use of UV-light when it allows decreasing the processing temperature.

The luminosity of the UV light used may be 20 mW/cm$^2$-1500 mW/cm$^2$. For example the luminosity can be from 20, 50, 100, 150, 200, 250, 300, 350, 400, 450, 500, 550, 600, 650, 700, 750, 800, 850, 900, 1000, 1050, 1100, 1150, 1200, 1250 or 1300 mW/cm$^2$ up to 50, 100, 150, 200, 250, 300, 350, 400, 450, 500, 550, 600, 650, 700, 750, 800, 850, 900, 950, 1000, 1050, 1100, 1150, 1200, 1250, 1300, 1350, 1400, 1450 or 1500 mW/cm$^2$. The duration of the use of UV light can be as long as the duration of the absorption of the oxygen atoms, or it may shorter or longer than this time period.

The UV light may be provided with any suitable light source, as is known in the art. The UV light may for example have a wavelength shorter than 315 nm, or shorter than 280 nm. The UV light may have a wavelength between 100 nm and 400 nm. Indeed, the wavelength may be from 100, 110, 130, 150, 170, 200, 215, 230, 250, 265, 280, 300, 315, 330, 350 or 360 nm up to 110, 130, 150, 170, 200, 215, 230, 250, 265, 280, 300, 315, 330, 350, 360, 380 or 400 nm.

The required conditions (wavelength, time, luminosity) may vary from one III-V compound to another. Some concrete examples are given below in the experimental section, and a person skilled in the art is readily able to find out suitable conditions, based on a few simple tests. One example is a surface made of InP, for which a wavelength of 185 nm and a luminosity of 1000 mW/cm$^2$ was suitable, whereas 395 nm and 20 mW/cm$^2$ did not work for this material.

When manufacturing or fabricating the semiconductor device of the present description, comprising three semiconductor layers, the method further comprises absorbing an oxygen dosage into a surface of the second semiconductor layer to form at least one corresponding crystalline terminating oxide layer; and growing the third semiconductor layer onto a top of the formed at least one crystalline terminating oxide layer of the second semiconductor layer. The obtained semiconductor device thus comprises a third semiconductor layer having a third material structure and an interface between the second semiconductor layer and the third semiconductor layer which consists of at least one corresponding crystalline terminating oxide layer of the second semiconductor layer. The first and second semiconductor layers are typically different from one another, and the third semiconductor layer may be the same as either the first or second semiconductor layer, or it may be different from both of them. Similarly, the crystalline structures of the first, second and optional third material structures may be mutually lattice-matched or mutually non-lattice matched. Alternatively, two of the material structures may be mutually lattice-matched while the remaining one is non-lattice matched, or vice versa.

According to an embodiment, at least one crystalline terminating oxide layer is a crystalline oxide layer formed by absorbing an oxygen dosage into the first semiconductor layer without causing an oxide structure to be formed upon the first semiconductor layer. Specifically, the oxide structure may refer to an amorphous oxide structure. More specifically, oxygen is used as a reagent, as compared to the traditional oxide layer formation processes which typically involve using more than one element reaction. Furthermore, the oxygen is absorbed into a crystalline lattice of a semiconductor material layer without causing any oxide growth deposition to occur onto the semiconductor material layer. More specifically, the amorphous oxide structure may be formed upon the first semiconductor layer, in an event of uncontrolled oxidation thereof. Additionally, the oxygen dosage may be absorbed into the first semiconductor layer in vacuum conditions. Furthermore, parameters such as temperature, partial pressure of oxygen, exposure time to oxygen dosage and so forth may be carefully monitored and controlled to control the crystal structure of the at least one crystalline terminating oxide layer. In addition, the parameters may be dependent on the material structure of the first semiconductor layer and the crystal structure of crystalline terminating oxide layer desired.

In an embodiment, indium atoms are deposited onto the first semiconductor layer prior to transforming the surface to a crystalline terminating oxide layer. In another embodiment, tin atoms are deposited onto the first semiconductor layer prior to transforming the surface to a crystalline terminating oxide layer. In yet a further embodiment both indium and tin atoms are deposited onto the first semiconductor layer prior to transforming the surface to a crystalline terminating oxide layer.

In an example, an external surface of the first semiconductor layer may be heated to a temperature of at least 200° C. and up to 550° C. for supporting the absorption of oxygen dosage. Specifically, the temperature may be selected depending upon the first material structure of the first semiconductor layer. Subsequently in the example, a reaction to form the crystalline terminating oxide layer may take place in vacuum conditions, with the chamber background pressure in range of $1\times10^{-11}$ milli-bar (mBar) to $1\times10^{-7}$ mBar. Subsequently, the external surface is exposed to a dosage of oxygen atoms at the selected temperature. In an embodiment, the oxygen dosage is selected to be low enough such that oxygen atoms of the oxygen dosage can adsorb and diffuse into the semiconductor layer without creating an amorphous structure on its external surface. The aforementioned relatively low oxygen dosage is achieved in practice, for example, by having an oxygen gas with partial pressure of less than $1\times10^{-7}$ to $1\times10^{-2}$ mBar in a vacuum chamber, which is comparatively much lower than pressure used in traditional growth process which varies between $1\times10^{-2}$ mBar to 1 Bar. Furthermore, the oxidation time may vary between seconds to 60 minutes. In such an instance, the diffused oxygen atoms of the oxygen dosage can form an oxide layer which is crystalline in nature, such as the aforementioned crystalline terminating oxide layer.

According to an embodiment, the oxygen dosage (which can also be called oxygen dose or oxygen flux) is between 100 and 5000000 Langmuir. The oxygen dosage can be for example from 100, 200, 500, 700, 1000, 1500, 2500, 4000, 5000, 6000, 7500, 10000, 15000, 30000, 35000, 50000, 70000, 80000, 90000, 100000, 115000, 125000, 200000, 350000, 500000, 750000, 800000, 1000000, 1500000, 2000000, 2500000, 3000000, 3500000, 4000000 or 4500000 Langmuir up to 200, 500, 700, 1000, 1500, 2500, 4000, 500, 6000, 7500, 10000, 15000, 30000, 35000, 50000, 70000, 80000, 90000, 100000, 115000, 125000, 200000, 350000, 500000, 750000, 800000, 1000000, 1500000, 2000000, 2500000, 3000000, 3500000, 4000000, 4500000 or 5000000 Langmuir.

In an embodiment, the oxygen dosage is between 50000 to 125000 Langmuir. Specifically, the oxygen dosage absorbed in a semiconductor layer may depend upon the partial pressure of the oxygen, exposure time of the semiconductor layer to the oxygen dosage and the crystal structure of the surface symmetry desired for application of the semiconductor layer. More specifically, one unit of Langmuir equates to $1.333 \times 10^{-6}$ mbar×sec. Optionally, the oxygen dosage is 125000 to 5000000 Langmuir. Furthermore, the oxygen dosage is selected to be low enough such that oxygen atoms of the oxygen dosage can adsorb and diffuse into the first semiconductor material without creating an amorphous surface structure on the external surface. It will be appreciated that a too high dosage of oxygen atoms will create an amorphous surface structure on the external surface.

In an embodiment, the oxygen dosage is 5000 to 50000 Langmuir. In an example, in order to manufacture a (3×1) crystal lattice structure of the crystalline terminating oxide layer with partial pressure of oxygen at $4 \times 10^{-6}$ mbar, 30 minutes of the exposure time is required. Therefore, in such example, the oxygen dosage is 5400 Langmuir.

In another embodiment, the oxygen dosage is 100 to 5000 Langmuir. In an example, in order to manufacture a c(4×2) crystal lattice structure of the crystalline terminating oxide layer with partial pressure of oxygen at 4×10-6 mbar, 5 minutes of the exposure time is required. Therefore, in such example, the oxygen dosage is 900 Langmuir.

In an embodiment, the at least one crystalline terminating oxide layer is less than 30 nanometres thick. Optionally, the at least one crystalline terminating oxide layer is less than 10 nanometres thick. More optionally, the at least one crystalline terminating oxide layer is less than 2 nanometres thick. Furthermore, the at least one crystalline terminating oxide layer may comprise crystal defects i.e. amorphous regions or other crystalline structures, but preferably most of the layer comprises said crystalline structure.

In an embodiment, the crystalline terminating oxide layer, in the semiconductor device, is implemented as a buried layer. Specifically, the crystalline terminating oxide layer as buried layer can confine current to a specified area of the semiconductor device. Such buried layer is useful in the construction of a semiconductor Vertical Cavity Laser (VCL). Furthermore, the crystalline terminating oxide layers, as formed, are resistant to air exposure and therefore retain crystallinity even with exposure to ambient air. This can circumvent contemporarily known problems of formation of low quality surface after exposure of a compound semiconductor wafer to ambient air pressure. Furthermore, these crystalline terminating oxide layers are synergistically capable of defining energy barriers in stacks of semiconductor layers for achieving improved electron confinement in the semiconductor device.

The crystalline terminating oxide layer has a crystal structure with a long range ordering of atoms. In practice, a first lattice structure at and close to surface of the first semiconductor layer transforms due to adsorbed oxygen atoms. Therefore, the formed crystalline terminating oxide layer contains oxygen and atoms of the III-V compound. In an embodiment, the crystalline terminating oxide layer is a crystalline compound semiconductor oxide. Since the amount of oxygen atoms is within predetermined range and those are administered in a control manner, the oxygen atoms will find themselves within a unit cell of semiconductor lattice at an adsorption site, and thus the formed oxygen termination layer will have a crystal structure. Moreover, the crystalline terminating oxide layer is a few atomic layers thick, for example, up to around substantially 3 nanometres thick, but may range up to a few hundred atomic layers thick. According to an embodiment, the at least one crystalline terminating oxide layer comprises hydrogen. Furthermore, according to an embodiment, the at least one crystalline terminating so oxide layer comprises nitrogen.

In an embodiment, the second semiconductor layer has been grown epitaxially onto a top of the first semiconductor layer onto which is formed a surface, wherein the formed surface comprises the at least one crystalline terminating oxide layer. Specifically, the term "epitaxy" described herein, refers to the deposition of a semiconductor layer onto the at least one crystalline terminating oxide layer using known epitaxial methods. More specifically, epitaxial methods employed to grow the second semiconductor layer include, but are not limited to, molecular beam epitaxy (MBE), chemical vapour deposition (CVD), plasma enhanced chemical vapour deposition (PECVD) and metal organic chemical vapour deposition (MOCVD). In an example, the semiconductor device may include a plurality of semiconductor layers therein.

According to an embodiment, the at least one crystalline terminating oxide layer is implemented as a plurality of crystalline terminating oxide layers within the device between their respective semiconductor layers. Specifically, the semiconductor device may comprise a plurality of semiconductors layers therein. Furthermore, at least one crystalline terminating oxide layer may be implemented between a respective pair of semiconductor layers.

In an implementation, at least one semiconductor layer may be grown epitaxially on a semiconductor substrate (such as, InP) after preparation and processing of the semiconductor substrate. Subsequently, the crystalline terminating oxide layer may be formed by transforming the first semiconductor layer by absorbing the oxygen dosage therein. Thereafter, a second semiconductor layer may be grown using known epitaxial methods on the formed crystalline terminating oxide layer. Subsequently, the second semiconductor layer may be exposed to oxygen dosage to form another crystalline terminating oxide layer. Furthermore, process of epitaxial growth and crystalline terminating oxide layer formation may be repeated based upon application of the semiconductor device comprising the semiconductor layers therein.

In another implementation, a semiconductor substrate may be exposed to oxygen dosage, after preparation and processing thereof. Consequently, a crystalline terminating oxide layer is formed by transforming the semiconductor substrate surface. Subsequently, a semiconductor layer is grown using known epitaxial methods on the formed crystalline terminating oxide layer. Thereafter, the grown semiconductor layer may be exposed to oxygen dosage to form another crystalline terminating oxide layer thereon. Furthermore, process of epitaxial growth and crystalline terminating oxide layer formation may be repeated based upon application of the semiconductor device comprising the semiconductor layers therein.

In an embodiment, the first and second semiconductor layers are incorporated as a part of an epitaxial semiconductor stack structure, wherein on top of a given crystalline terminating oxide layer of the stack structure is grown one or more epitaxial semiconductor layers, wherein the given crystalline terminating oxide layer is formed by oxidizing the semiconductor surface without forming an oxide structure thereupon. Specifically, the semiconductor device may be a heterostructure device with layers or regions of dissimilar crystalline semiconductors, for example, but not limited to, semiconducting materials having unequal band gaps.

According to an embodiment, a method of fabricating the semiconductor device comprises arranging at least one further semiconductor layer on the semiconductor layer, before arranging the second crystalline terminating oxide layer. In embodiments of the present disclosure, the semiconductor device is fabricated as a heterostructure by using epitaxial fabrication processes. Furthermore, crystallinity of such semiconductor device can be improved by utilizing a crystalline oxide termination layer as a platform for epitaxial regrowth onto the aforesaid crystalline oxide termination layer. Specifically, it may be feasible to improve crystal quality of semiconductor structures in applications where semiconductor regrowth is necessary, by employing epitaxial growth of layers onto crystalline terminating oxide layer structures. Additionally, known epitaxial growth methods used to manufacture the heterostructures include, but are not limited to, metal-organic chemical vapour deposition (MOCVD) and molecular beam epitaxy (MBE), and by performing oxidation either simultaneously with the epitaxial growth, or alternating epitaxial growth and oxidation of the surface to transform the surface into a crystalline semiconductor oxide. Such techniques for manufacturing semiconductor devices are well known in the art, and have not been described herein in detail for the brevity of the present disclosure. By performing such epitaxial growth and oxidation simultaneously, it is feasible to create a thicker layer of crystalline semiconductor oxide than what is achievable by merely utilizing oxidation of an epitaxial semiconductor surface. In such embodiments, there is provided a benefit of the creation of oxygen containing epitaxial structures which are resistant to further oxygen exposure, and on which it is possible to grow epitaxial material.

In an embodiment, based upon use of III-V semiconductor heterostructures, it may be necessary to implement epitaxial layer growth after executing processing. Examples of processing methods may include, etching, semiconductor regrowth, metal contact formation, but are not limited thereto. Furthermore, generated etched surfaces may be typically of lower quality than an initial corresponding surface, due to uneven etching of the surface, residual etchant molecules or oxygen induced disorder. Such disorder and worsened quality of the surface is so harmful to semiconductor regrowth. In the present semiconductor device, the crystalline terminating oxide layers are optionally used as an etch stop layer. When embodiments of the present disclosure are employed, namely use of a crystalline terminating oxide layer, such layer is beneficial to facilitate subsequent semiconductor regrowth, for example via epitaxial deposition.

In an embodiment, the at least one crystalline terminating oxide layer may be fabricated concurrently with epitaxially forming the second semiconductor layer onto the first semiconducting layer. According to another embodiment, the at least one crystalline terminating oxide layer may be fabricated prior to epitaxially forming the second semiconductor layer onto the first semiconducting layer. Furthermore, when forming the crystalline terminating oxide layer, the employed oxygen distribution is varied spatially. Such a variation is optionally implemented as two or more different crystal phases, where each of the crystal phase or phases is monitored by employing a suitable instrument, such as low energy electron diffraction (LEED), reflection high energy electron diffraction (RHEED) or reflectance anisotropy spectroscopy (RAS). In an example, the oxygen distribution in a vertical direction, relative to a plane of the aforesaid external surface, for fabrication of the terminating oxide layer, can be controlled, for example, by implementing epitaxial growth concurrently while performing surface oxidation and also whilst varying the aforementioned oxygen dosage. Furthermore, the formed crystalline terminating oxide layer is uniform in its lateral dimensions relative to a plane of the aforesaid external surface of the semiconductor substrate.

According to an embodiment, the first material structure and the second material structure are crystalline structures that are mutually lattice-matched. According to an alternate embodiment, the first material structure and the second material structure are crystalline structures that are mutually non-lattice-matched. Specifically, the surface symmetry of first and second material structure may or may not be different. In an example, the crystal lattice structure of the first material structure may be lattice-matched with the second material structure. In another example, the crystal lattice structure of the second material structure may be non-lattice matched with the second material structure. Furthermore, the surface symmetry of the first and second material structure may be affected by the crystalline terminating oxide layer.

In an embodiment, the method of fabricating a semiconductor device comprises selectively lithographically patterning the at least one crystalline terminating oxide layer. Specifically, lithographic printing is a processing technique that uses light, electrons or mechanical deformation to transfer a geometric pattern from a mask to a light-sensitive or electron-sensitive chemical resist material or deforming imprint resist material on a semiconductor substrate. More specifically, lithographic printing may be employed after formation of at least one crystalline terminating oxide layer on a semiconductor substrate. Furthermore, based on the application of the semiconductor device, a crystalline terminating oxide layer may undergo selective lithographic patterning multiple times.

In an embodiment, the crystalline terminating oxide layer is removed prior to the growth of the second semiconductor layer. Specifically, the crystalline terminating oxide layer may be removed based on the application of the semiconductor device comprising crystalline terminating oxide layer. In an example, the crystalline terminating oxide layer may be removed from the top surface of the semiconductor device to implement gate, source and drain contacts in a Field-Effect Transistor (FET) application.

According to an embodiment, at least one of the semiconductor layers is operable to provide a conduction path for an electrical signal, and wherein the conduction path has charge carriers whose density in operation is controlled by an applied electric field, thus making the semiconductor device of the present disclosure suitable for Field-Effect Transistor (FET) applications.

In an embodiment, the semiconductor device may be implemented as a High-Electron Mobility Transistor (HEMT) epitaxial heterostructure. In an example, a substrate (such as, an InP substrate) may be chemically treated to remove contaminants such as carbon from an external surface of the substrate. Thereafter, the substrate may be processed in a processing chamber, wherein a heterostructure containing a high electron mobility transistor (HEMT) structure is grown with MOCVD onto the wafer. Optionally, diffusion and active regions of semiconductor may be defined in the heterostructure. Subsequently, a crystalline terminating oxide layer may be formed on the heterostructure using oxygen dosage. Thereafter, a dielectric layer (such as, $Al_2O_3$, $HfO_2$ or $ZrO_2$) or a combination of dielectric layers may be implemented on the formed crystalline terminating oxide layer. Furthermore, in the example, at least the dielectric is etched to create regions for semiconductor regrowth. Consequently, a semiconductor (such as, Gallium Arsenide) is regrown on the etched regions. Subsequently, metal contacts for source, gate and drain are deposited thereon. Furthermore, the High-Electron Mobility Transistor (HEMT) epitaxial heterostructure may be passivated using an electrically insulating material. Specifically, the HEMT epitaxial heterostructure may be passivated to provide electrical stability by isolating the transistor surface from electrical and chemical conditions in the environment. Moreover, passivation may reduce reverse-current leakage from the transistor.

The present description also relates to the method as described above. The various embodiments and variants disclosed above apply mutatis mutandis to the method.

The present description still further relates to a method of fabricating a semiconductor device, comprising
 obtaining a III-V compound semiconductor layer;
 absorbing an oxygen dosage into a surface of the III-V compound semiconductor layer to form at least one corresponding crystalline terminating oxide layer;
wherein forming of the corresponding crystalline terminating oxide layer comprises illuminating the III-V compound semiconductor surface and/or the oxygen dosage with UV light.

All the various embodiments and variants disclosed above apply mutatis mutandis to this method, also. Indeed, the use of UV-light is applicable to any manufacturing method of a semiconductor comprising III-V compounds.

EXPERIMENTAL PART

Some semiconductor structures were manufactured according to the following setup.

The reactor chamber was an ultra-high-vacuum (UHV) chamber made from stainless steel using CF-flanges. A turbomolecular pump was used to create the UHV in the reactor chamber. An inlet for oxygen-containing gas was a precision leak valve which allows the gas pressure to be controlled very precisely in UHV and high-vacuum (HV) ranges. Because UV light can be absorbed by window materials, the UV lamp was positioned inside the reactor chamber. This was done using CF-flange connection, as such setup does not compromise vacuum quality.

In one experiment, the lamp was positioned so that during formation of the corresponding crystalline terminating oxide layer the UV light irradiated both the III-V surface and the oxygen containing gas. In another experiment, the UV lamp is positioned so that only the oxygen containing gas was irradiated. Two different types on UV lamps were used in different experiments, namely a Xenon arc lamp and a Xenon excimer lamp and a Xenon lamp emitting 172 nm light. The UV light power, the oxygen-containing gas, the oxygen-containing gas pressure, the oxidation time and the III-V surface temperature were selected according to the III-V surface to be treated and the crystalline structure to be obtained.

In one experiment, the UV lamp was positioned to irradiate both the III-V surface and the oxygen-containing gas, III-V surface was InP, the UV light power was 500 mW/cm$^2$, the oxygen-containing gas was O2, the oxygen containing gas pressure was 5*10$^{-6}$ mbar, the oxidation time was 10 min, the III-V surface temperature was 450° C., and the resulting crystalline structure had a (2×3) symmetry seen with low-energy electron diffraction (LEED) instrument. In this experiment, the LEED diffraction pattern of corresponding crystalline terminating oxide layer is (2×3) without the presence of original (2×4) pattern.

DESCRIPTION OF THE DRAWINGS

Figure 1B:
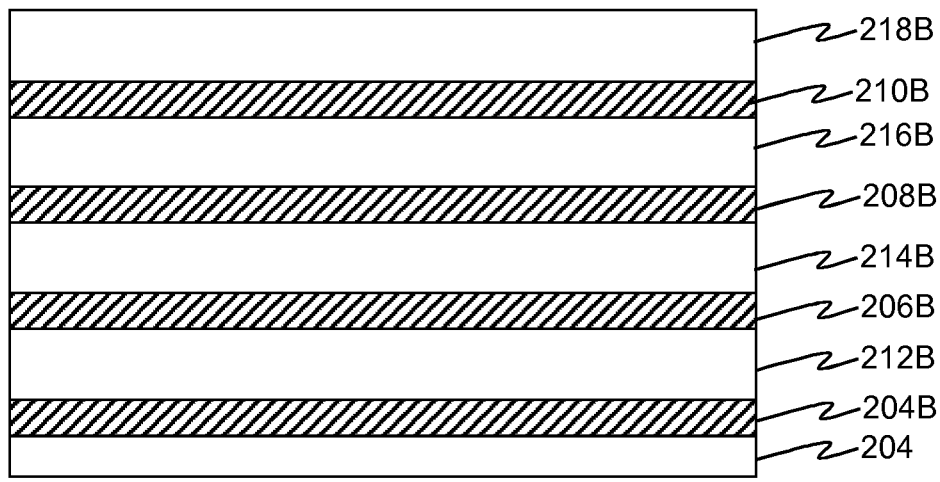

Referring to FIGS. 1A-1B, there are shown illustrations of exemplary implementations of the semiconductor device as epitaxial semiconductor stack structures, in accordance with different embodiments of the present disclosure. It may be understood by a person skilled in the art that the FIGS. 1A-1B include simplified arrangements for implementation of the semiconductor device for sake of clarity, which should not unduly limit the scope of the claims herein. The person skilled in the art will recognize many variations, alternatives, and modifications of embodiments of the present disclosure.

Referring to FIG. 1A, there is shown an illustration of exemplary implementation of a semiconductor device 202A as epitaxial semiconductor stack structure, in accordance with an embodiment of the present disclosure. As shown, the semiconductor device 202A comprises a semiconductor substrate 204 (such as, GaAs). In the implementation, at least one semiconductor layer 204A may be grown epitaxially on a semiconductor substrate 204 after preparation and processing of the semiconductor substrate 204. Furthermore, at least one crystalline terminating oxide layer is implemented as a plurality of crystalline terminating oxide layers, such as the crystalline terminating oxide layers 212A, 214A, 216A, within the semiconductor device 202A between their respective semiconductor layers 204A, 206A, 208A, 210A.

Referring to FIG. 1B, there is shown an illustration of exemplary implementation of a semiconductor device 202B as epitaxial semiconductor stack structure, in accordance with another embodiment of the present disclosure. As shown, the semiconductor device 202B comprises a semiconductor substrate 204. In the implementation, the semiconductor substrate 204 may be exposed to oxygen dosage, after preparation and processing thereof. Consequently, a crystalline terminating oxide layer 204S is formed by transformation of the surface of the semiconductor substrate 204. Furthermore, the first and second semiconductor layers are incorporated as a part of an epitaxial semiconductor stack structure, wherein on top of a given crystalline terminating oxide layer, such as the crystalline terminating oxide layers 204B, 206B, 208B, 210B, of the stack structure is grown one or more epitaxial semiconductor layers, such as the semiconductor layers 212B, 214B, 216B, 218B, wherein the given crystalline terminating oxide layer is formed by oxidizing the semiconductor surface without forming an oxide structure thereupon.

Figure 2:
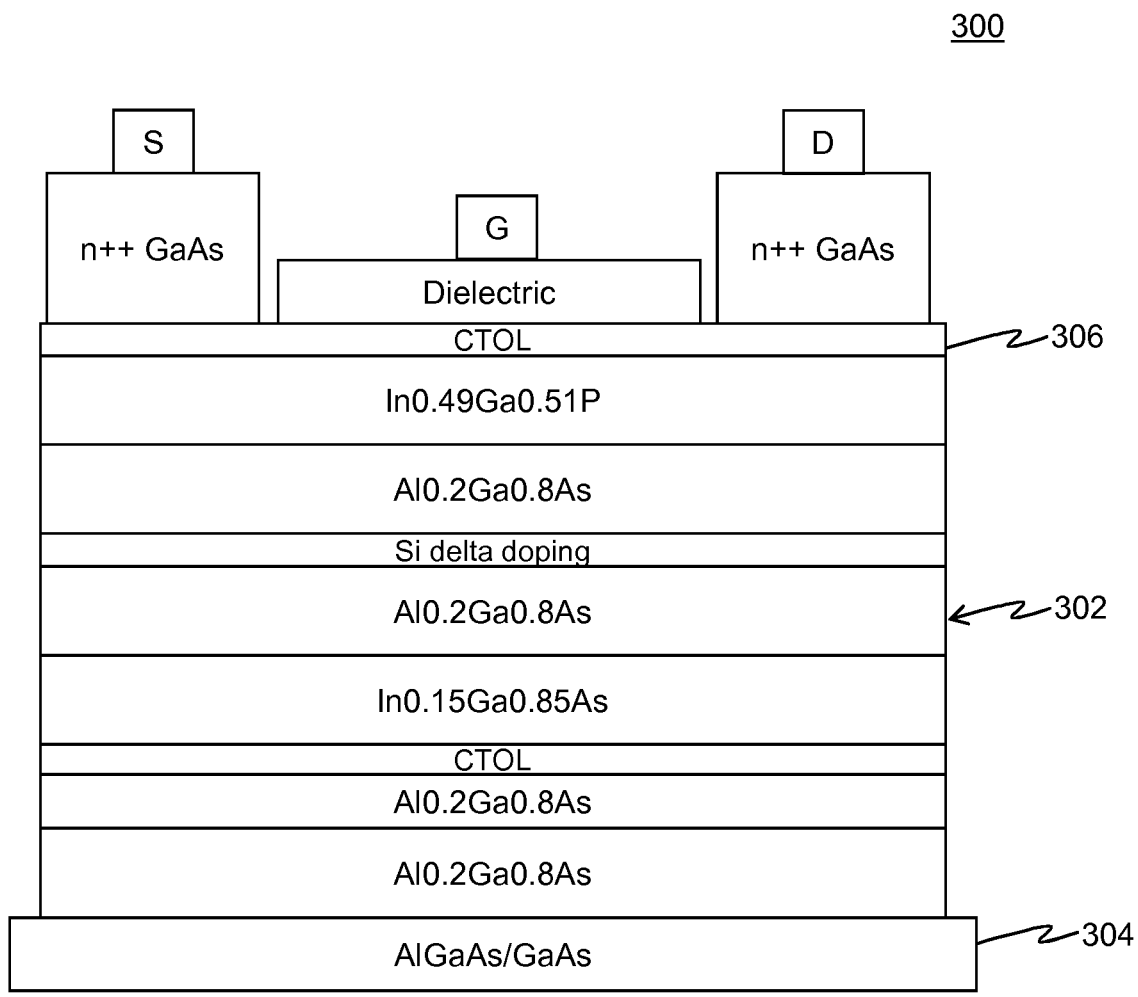
FIG. 2 is an illustration of an implementation of a semiconductor device as a High-Electron Mobility Transistor (HEMT), in accordance with an exemplary embodiment of the present disclosure.

Referring to FIG. 2, there is shown an illustration of an implementation of a semiconductor device 300 as a High-Electron Mobility Transistor (HEMT), in accordance with an exemplary embodiment of the present so disclosure. As shown, the semiconductor device may comprise an epitaxial heterostructure 302 grown on a semiconductor substrate 304. Subsequently, a crystalline terminating oxide layer 306 may be formed by transformation of the surface of the epitaxial heterostructure 302 using oxygen dosage. Thereafter, a dielectric layer may be implemented on the formed crystalline terminating oxide layer 306. Furthermore, the dielectric is etched to create regions for semiconductor regrowth. Consequently, a heavily doped (n++) semiconductor (such as, Gallium Arsenide) is regrown on the crystalline terminating oxide layers exposed by the etching. Subsequently, metal contacts for source, gate and drain are deposited thereon.

Figure 3:
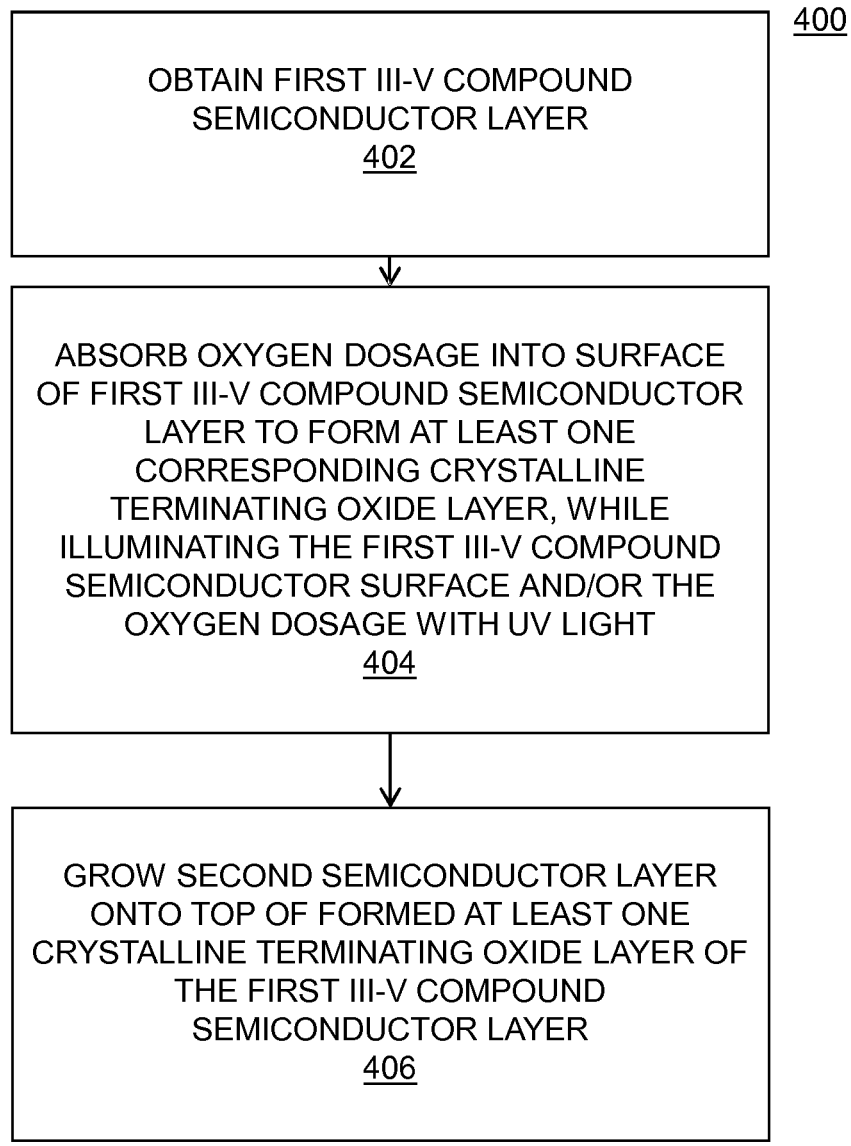
FIG. 3 is an illustration of steps of a method fabricating a semiconductor device, in accordance with an embodiment of the present disclosure.

Referring to FIG. 3, there is shown an illustration of steps of a method 400 of fabricating a semiconductor device, in accordance with an embodiment of the present disclosure. At a step 402, first semiconductor layer is obtained. At step 404, an oxygen dosage is absorbed into a surface of the first semiconductor layer to form at least one corresponding crystalline terminating oxide layer. At step 406, a second semiconductor layer is grown onto a top of the formed at least one crystalline terminating oxide layer of the first semiconductor layer.

The steps 402 to 406 are only illustrative and other alternatives can also be provided where one or more steps are added, one or more steps are removed, or one or more steps are provided in a different sequence without departing from the scope of the claims herein. In an example, the at least one crystalline terminating oxide layer is a crystalline oxide layer formed by absorbing an oxygen dosage into the first semiconductor layer without causing an oxide structure to be formed upon the first semiconductor layer. In another example, the method 400 comprises implementing the at least one crystalline terminating oxide layer as a plurality of crystalline terminating oxide layers within the device between their respective semiconductor layers. Optionally, the method 400 comprises fabricating the semiconductor device to include a plurality of semiconductor layers fabricated from III-V semiconductor materials. More optionally, the method 400 comprises arranging for the crystalline terminating oxide layers to have a crystal structure surface symmetry that is at least one of: (3×), (3×2), (2×3), c(4×2), (2×1), (1×2), (3×3), (1×1), (4×3). Optionally, the method 400 comprises arranging for the first and second semiconductor layers to be incorporated as a part of an epitaxial semiconductor stack structure, wherein on top of a given crystalline terminating oxide layer of the stack structure is grown one or more epitaxial semiconductor layers, wherein the given crystalline terminating oxide layer is formed by oxidizing the semiconductor surface without forming an oxide structure thereupon. In an embodiment, the method 400 comprises arranging for the first material structure and the second material structure to be crystalline structures that are mutually lattice-matched. In another embodiment, the method 400 comprises arranging for the first material structure and the second material structure to be crystalline structures that are mutually non-lattice-matched. In an example, the method 400 comprises arranging for the first material structure to be a GaAs composition and the second material structure to be an AlGaAs composition. In another example, the method 400 comprises arranging for the first material structure to be an InGaN composition and the second material structure to be an AlGaN composition. In yet another example, the method 400 comprises arranging for the first material structure to be a GaN composition and the second material structure to be an AlGaN composition. Moreover, in an example, the method 400 comprises arranging for the first material structure to be an InP composition and the second material structure to be an InGaAs composition. Furthermore, in an example, the method 400 comprises arranging for the first material structure to be an InGaAs composition and the second material structure to be an InP composition.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A method for manufacturing a semiconductor device implemented as a High-Electron Mobility Transistor (HEMT) epitaxial heterostructure comprising:
   obtaining a III-V semiconductor substrate;
   chemically treating the substrate to remove contaminants from an external surface of the substrate;
   growing, in a processing chamber, with Metal Organic Chemical Vapor Deposition (MOCVD) and/or Molecular Beam Epitaxy (MBE), a heterostructure containing a high electron mobility transistor (HEMT) structure onto the substrate;
   forming a crystalline terminating oxide layer on the heterostructure;
   implementing a dielectric layer or a combination of dielectric layers on the formed crystalline terminating oxide layer;
   etching the dielectric layer to create regions for semiconductor regrowth;
   re-growing a semiconductor layer on the etched regions; and
   depositing metal contacts for source and drain on the re-grown semiconductor layer;
   wherein the heterostructure containing a high electron mobility transistor (HEMT) structure comprises
   a first III-V compound semiconductor layer having a first material structure;
   a second semiconductor layer having a second material structure;
   a third semiconductor layer having a third material structure;
   wherein an interface between the first semiconductor layer and the second semiconductor layer consists of at least one corresponding crystalline terminating oxide layer of the first semiconductor layer, implemented as a buried layer, and
   wherein the crystalline terminating oxide layers are formed using oxygen dosage and illuminating the compound semiconductor surface and/or the oxygen dosage with UV light.

2. A method according to claim 1, wherein the substrate is InP.

3. A method according to claim 1, wherein contaminants include carbon.

4. A method according to claim 1, further comprising defining diffusion and active regions of semiconductor in the heterostructure.

5. A method according to claim 1, wherein the dielectric layer is selected from $Al_2O_3$, $HfO_2$ and $ZrO_2$.

6. A method according to claim 1, wherein the re-grown semiconductor layer is GaAs.

7. A method according to claim 1, comprising further crystalline terminating oxide layers between their respective semiconductor layers.

8. A method according to claim 1, wherein at least two of the semiconductor layer are III-V semiconductor layers.

9. A method of claim 1, wherein at least one of the crystalline terminating oxide layers has a crystal structure surface symmetry that is at least one of: (3×1), (3×2), (2×3), c(4×2), (2×1), (1×2), (3×3), (1×1), (4×3), (3√3×3√3–R30°).

10. A method of claim 1, wherein the first material structure, the second material structure and the third material structure are crystalline structures that are mutually lattice-matched.

11. A method of claim 1, wherein the first material structure, the second material structure and the third material structure are crystalline structures that are mutually non-lattice-matched.

12. A method of claim 1, wherein the first material structure, the second material structure and the third material structure is independently selected from a GaAs composition, an AlGaAs composition, an InGaP composition, an InGaN composition, an AlGaN composition, a GaN composition, an InP composition and InGaAs composition.

13. A method of claim 1, wherein the at least one crystalline terminating oxide layer comprises hydrogen and/or nitrogen.

14. A method of claim 1, wherein the crystalline terminating oxide layer is a crystalline compound semiconductor oxide layer.

15. A method of claim 1, wherein the oxygen dosage is between 5000 to 5000000 Langmuir.

16. A method according to claim 1, further comprising implementing the at least one crystalline terminating oxide layer of the heterostructure as a plurality of crystalline terminating oxide layers within the device between their respective semiconductor layers.

17. A method of claim 1, further comprising arranging, in the heterostructure, for the first and second semiconductor layers to be incorporated as a part of an epitaxial semiconductor stack structure, wherein on top of a given crystalline terminating oxide layer of the stack structure is grown one or more epitaxial semiconductor layers, wherein the given crystalline terminating oxide layer is formed by oxidizing the semiconductor surface layer to transform the surface of the semiconductor layer to a terminating oxide layer.

18. A method of claim 1, comprising selectively lithographically patterning the at least one crystalline terminating oxide layer, when growing the heterostructure.

19. A method of claim 1, further comprising depositing indium and/or tin atoms onto the first semiconductor layer before absorbing an oxygen dosage into a surface of the first semiconductor layer, when growing the heterostructure.

20. A computer program product comprising a non-transitory computer-readable storage medium having computer-readable instructions stored thereon, the computer-readable instructions being executable by a computerized device comprising processing hardware to execute a method as claimed in claim 1.

* * * * *